US007125646B2

(12) United States Patent
Mori

(10) Patent No.: US 7,125,646 B2
(45) **Date of Patent: *Oct. 24, 2006**

(54) PRINTING PLATE MATERIAL AND PRINTING PROCESS

(75) Inventor: Takahiro Mori, Hachioji (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/007,548

(22) Filed: Dec. 8, 2004

(65) Prior Publication Data

US 2005/0130062 A1 Jun. 16, 2005

(30) Foreign Application Priority Data

Dec. 16, 2003 (JP) ............................ 2003-417699

(51) Int. Cl.
*G03F 7/14* (2006.01)
*G03F 7/11* (2006.01)

(52) U.S. Cl. .................... 430/271.1; 430/302; 430/964

(58) Field of Classification Search ............. 430/271.1, 430/302, 964
See application file for complete search history.

(56) References Cited

U.S. PATENT DOCUMENTS

| | | | | |
|---|---|---|---|---|
| 6,132,934 | A * | 10/2000 | Vermeersch et al. | 430/273.1 |
| 6,399,270 | B1 * | 6/2002 | Mori et al. | 430/270.1 |
| 6,500,599 | B1 | 12/2002 | Inno et al. | |
| 2002/0172891 | A1 * | 11/2002 | Mori | 430/302 |
| 2005/0056179 | A1 * | 3/2005 | Mori | 101/457 |

FOREIGN PATENT DOCUMENTS

| | | |
|---|---|---|
| EP | 1 266 751 A2 | 12/2002 |
| EP | 1 470 915 A1 | 10/2004 |
| EP | 1 470 916 A2 | 10/2004 |
| EP | 04 10 6393 | 4/2005 |

* cited by examiner

*Primary Examiner*—Richard L. Schilling
(74) *Attorney, Agent, or Firm*—Lucas & Mercanti, LLP

(57) ABSTRACT

Disclosed are a printing plate material comprising a support and provided thereon, a hydrophilic layer and a thermosensitive image formation layer in that order, wherein the hydrophilic layer contains from 40 to 90% by weight of metal oxide particles having a light-to-heat conversion function and the thermosensitive image formation layer contains from 10 to 50% by weight of a water-soluble polymer.

6 Claims, No Drawings

PRINTING PLATE MATERIAL AND PRINTING PROCESS

FIELD OF THE INVENTION

The present invention relates to a printing plate material, and particularly to a printing plate material used in a computer to plate (CTP) system.

BACKGROUND OF THE INVENTION

In recent years, printing employing a CTP system has been conducted in printing industries, accompanied with the digitization of printing data. A printing plate material for CTP, which is inexpensive, can be easily handled, and has a printing ability comparable with that of a PS plate, is required.

A versatile processless printing plate has been sought, which has a direct imaging (DI) property not requiring any development employing a specific developer, can be applied to a printing press with a direct imaging (DI) function, and can be handled in the same manner as in PS plates.

A thermal processless printing plate material is imagewise exposed employing an infrared laser with an emission wavelength of from near-infrared to infrared regions to form an image. The thermal processless printing plate material employing this method is divided into two types; an ablation type printing plate material and an on-press development type printing plate material with a heat melting image formation layer.

Examples of the ablation type printing plate material include those disclosed in for example, Japanese Patent O.P.I. Publication Nos. 8-507727, 6-186750, 6-199064, 7-314934, 10-58636 and 10-244773.

These references disclose a printing plate material comprising a support, and provided thereon, a hydrophilic layer and a lipophilic layer, either of which is an outermost layer. When a printing plate material is imagewise exposed in which the hydrophilic layer is an outermost layer, the hydrophilic layer is removed by ablation to reveal the lipophilic layer, whereby an image is formed. This printing plate material has problem that the exposure device used is contaminated by the ablated matter, and a special suction device is required for removing the scattered material. Therefore, this printing plate material is low in versatility to the exposure device.

A printing plate material has been developed which is capable of forming an image without ablation, and does not require development treatment employing a special developer or wiping-off treatment. There is, for example, a printing plate material for CTP as disclosed in Japanese Publication Nos. 2938397 and 2938397, which comprises an image formation layer containing thermoplastic particles and a water-soluble binder and which is capable of be developed with a dampening solution or printing ink on a printing press (on-press development).

Generally, a light-to-heat conversion material (generally colored) needs to be incorporated in the image formation layer, and is transferred to a printing ink or a dampening solution during printing, which causes problem of contaminating a printing press during on-press-development.

As a method for preventing the contamination of a printing press which is caused during on-press development, a method has been proposed which employs, as a hydrophilic support, a support in which a hydrophilic layer containing a light-to-heat conversion material is provided on a substrate. Such a hydrophilic layer makes it possible to eliminate the light-to-heat conversion material from the image formation layer. Further, this method can achieve high sensitization without contaminating a printing press, since it can increase the amount of the light-to-heat conversion material in the hydrophilic layer or incorporate a slight amount of the light-to-heat conversion material in the image formation layer.

In order to improve function of the hydrophilic layer of the printing plate material for CTP, for example, a printing property and an image retention property, there is proposed a hydrophilic layer (see, for example, Japanese Patent O.P.I. Publication No. 2000-225780) containing porous inorganic fillers with a particle size not more than 1.0 μm as well as the light-to-heat conversion material, or a hydrophilic layer (see, for example, Japanese Patent O.P.I. Publication No. 2002-370465) containing plural irregularity structure-forming inorganic fillers and an inorganic binder with high porosity as well as the light-to-heat conversion material.

A processless printing plate material for CTP is required which provides higher sensitivity and better printing performance.

However, even a printing plate material comprising the hydrophilic layer described above has been difficult to improve printing properties including sensitivity and printing durability.

In a processless printing plate material for CTP capable of being developed on a press, a layer with scratches cannot be developed, which may cause stains on the background of prints. A method solving this problem is also required.

SUMMARY OF THE INVENTION

An object of the invention is to provide a printing plate material for CTP system providing high sensitivity, good printability, high printing durability, and an excellent handling property.

DETAILED DESCRIPTION OF THE INVENTION

The above object of the invention can be attained by the following constitutions.

Item 1. A printing plate material comprising a support and provided thereon, a hydrophilic layer and a thermosensitive image formation layer in that order, wherein the hydrophilic layer contains from 40 to 90% by weight of metal oxide particles having a light-to-heat conversion function and the thermosensitive image formation layer contains from 10 to 50% by weight of a water-soluble polymer.

Item 2. The printing plate material of item 1 above, wherein the metal oxide particles have an average particle size of from 0.15 to 1.0 μm.

Item 3. The printing plate material of item 1 or 2 above, wherein the metal oxide particles are iron oxide ($Fe_3O_4$) particles.

Item 4. The printing plate material of item 3 above, wherein the iron oxide ($Fe_3O_4$) particles are in the form of sphere or octahedron.

Item 5. The printing plate material of any one of items 1 through 4 above, wherein the thermosensitive image formation layer contains thermoplastic particles.

Item 6. A printing process comprising the steps of imagewise exposing the printing plate material of any one of items 1 through 5 above; mounting the printing plate material on a plate cylinder of a printing press, and developing the mounted printing plate material with a dampening solution or with a dampening solution and printing ink.

The present invention will be explained in detail below.

The planographic printing plate of the invention is a printing plate material comprising a support and provided thereon, a hydrophilic layer and a thermosensitive image formation layer in that order, wherein the hydrophilic layer contains from 40 to 90% by weight of metal oxide particles having a light-to-heat conversion function and the thermosensitive image formation layer contains from 10 to 50% by weight of a water-soluble polymer.

The planographic printing plate of the invention is exposed to a near-infrared to infrared laser, whereby heat is generated in the hydrophilic layer at exposed portions, and the thermosensitive image formation layer is heated by the heat to form an image on the thermosensitive image formation layer. The image formation may be a positive image formation in which the thermosensitive image formation layer at exposed portions is changed due to heat so as to be easily removed, and a negative image formation in which the thermosensitive image formation layer at exposed portions is changed due to heat so as to be removed with difficulty.

The preferred planographic printing plate of the invention is a negative-working planographic printing plate of the on-press development type, in which the thermosensitive image formation layer at exposed portions is changed due to heat so as to be removed with difficulty, and the thermosensitive image formation layer at unexposed portions is removed by ink or a dampening solution on a plate cylinder of a printing press to reveal the hydrophilic layer under the unexposed thermosensitive image formation layer.

(Support)

As the support in the invention, those well known in the art as supports for printing plates can be used. Examples of the support include a metal plate, a plastic film sheet, a paper sheet treated with polyolefin, and composite materials such as laminates thereof. The thickness of the support is not specifically limited as long as a printing plate having the support can be mounted on a printing press, and is advantageously from 50 to 500 μm in easily handling.

Examples of the metal plate include iron, stainless steel, and aluminum. Aluminum is especially preferable in its gravity and stiffness. Aluminum is ordinarily used after degreased with an alkali, an acid or a solvent to remove oil on the surface, which has been used when rolled and wound around a spool. The degreasing is carried out preferably employing an aqueous alkali solution. In order to increase adhesion between the support and a coating layer, it is preferred that the surface of the support is subjected to adhesion increasing treatment or is coated with a subbing layer. For example, the support is immersed in a solution containing silicate or a coupling agent such as a silane coupling agent, or the support is coated with the solution and then sufficiently dried. Anodization treatment is considered to be one kind of adhesion increasing treatment, and can be used. The anodization treatment and the immersing or coating treatment described above can be used in combination. Aluminum plate (so-called grained aluminum plate), which has been surface-roughened with a conventional method, can be used as a support having a hydrophilic surface.

Examples of the plastic film include a polyethylene terephthalate film, a polyethylene naphthalate film, a polyimide film, a polyamide film, a polycarbonate film, a polysulfone film, a polyphenylene oxide film, and a cellulose ester film.

The plastic film is preferably a polyethylene terephthalate film, or a polyethylene naphthalate film. In order to increase adhesion between the support and a coating layer, it is preferred that the surface of the plastic film is subjected to adhesion increasing treatment or is coated with a subbing layer. Examples of the adhesion increasing treatment include corona discharge treatment, flame treatment, plasma treatment and UV light irradiation treatment. Examples of the subbing layer include a layer containing gelatin or latex. The subbing layer can contain known organic or inorganic electrically conductive material.

A support can be preferably used which is provided with a known back coat layer for the purpose of controlling slipping property of the back coat layer (for example, reducing a coefficient of friction between the back coat layer and the surface of the plate cylinder of a press) or controlling the electroconductivity.

(Hydrophilic Layer)

The hydrophilic layer is a layer forming non-image portions, which repels ink during printing.

The hydrophilic layer in the invention contains from 40 to 90% by weight of metal oxide particles having a light-to-heat conversion function, which provides high sensitivity and printing durability.

The hydrophilic layer in the invention contains preferably from 45 to 80% by weight of the metal oxide particles.

Herein, "a light-to-heat conversion function" is a function, which generates heat by absorbing a light with a wavelength of from 700 to 1500 nm to form an image.

The metal oxide particles in the invention are particles containing metal oxide, and exist as particles in the hydrophilic layer. The average particle size of the metal oxide particles is preferably from 0.15 to 1.0 μm, more preferably from 0.15 to 0.5 μm, and still more preferably from 0.15 to 0.3 μm.

As metal oxide particles having a light-to-heat conversion function, black metal oxide particles having absorbing the whole wavelength of visible regions are preferably used in view of good light-to-heat conversion effect.

Typically, metal oxide particles such as particles of black-colored titanium black, black complex metal oxides, and black iron oxide ($Fe_3O_4$) are preferably used.

Examples of the black complex metal oxides include complex metal oxides comprising at least two selected from Al, Ti, Cr, Mn, Fe, Co, Ni, Cu, Zn, Sb, and Ba. These can be prepared according to the methods disclosed in Japanese Patent O.P.I. Publication Nos. 9-27393, 9-25126, 9-237570, 9-241529 and 10-231441.

The complex metal oxide is preferably a complex Cu—Cr—Mn complex metal oxide or a Cu—Fe—Mn complex metal oxide. The Cu—Cr—Mn complex metal oxide is preferably subjected to treatment disclosed in Japanese Patent O.P.I. Publication Nos. 8-27393 in order to reduce isolation of a 6-valent chromium ion.

In the invention, iron oxide ($Fe_3O_4$) particles are especially preferably used as iron oxide particles having a light-to-heat conversion function. The iron oxide ($Fe_3O_4$) particles have an acicular ratio (major axis length/minor axis length) of preferably from 1 to 1.5. It is preferred that the iron oxide particles are substantially spherical ones (having an acicular ratio of 1) or octahedral ones (having an acicular ratio of 1.4).

Examples of the iron oxide ($Fe_3O_4$) particles include for example, TAROX series produced by Titan Kogyo K.K. Examples of the spherical particles include BL-100 (having a particle size of from 0.2 to 0.6 μm, and BL-500 (having a particle size of from 0.3 to 1.0 μm. Examples of the octahedral particles include ABL-203 (having a particle size of from 0.4 to 0.5 μm, ABL-204 (having a particle size of from 0.3 to 0.4 μm, ABL-205 (having a particle size of from 0.2 to 0.3 μm, and ABL-207 (having a particle size of 0.2 μm.

The black iron oxide particles may be surface-coated with inorganic compounds such as $SiO_2$. Examples of such black iron oxide particles include spherical particles BL-200 (having a particle size of from 0.2 to 0.3 μm) and octahedral particles ABL-207A (having a particle size of 0.2 μm), each having been surface-coated with $SiO_2$.

These iron oxide ($Fe_3O_4$) particles are easily dispersed in water, and have characteristics in that they are poured as powder in water and stirred to obtain a dispersion in which the particles are uniformly dispersed. In the process in which a hydrophilic layer containing iron oxide ($Fe_3O_4$) particles is coated on a support and dried, the iron oxide ($Fe_3O_4$) particles are linked with one another to form a high order structure and form a roughness with a waviness of from several to scores microns, whereby a multi-roughness surface, in which submicron irregularities are superposed, is formed on the hydrophilic layer. The mechanism of such a surface formation is not clear, but is considered to be due to slight magnetism which the particles themselves have. The multi-roughness surface provides printing properties equal to those of a grained aluminum plate and greatly improves an image retention property.

In the invention, an average particle size is an average particle size of particles, which exist in the form of particles in the hydrophilic layer, and not an average particle size of first order particles.

In the invention, the particle size of particles in the form of spheres is represented by the diameter of the particles, and the particle size of particles in the form other than spheres by an average of the major axis and the minor axis of the projected image of the particles, i.e., (major axis+minor axis)/2. In the invention, the particle size of one hundred particles is measured by means of a scanning electron microscope S-800 (produced by Hitachi Seisakusho Co., Ltd.) at a magnification of 20,000, and the average is defined as an average particle size of particles.

In order to maintain a water retention property of the hydrophilic layer, the hydrophilic layer preferably contains the following materials for surface-roughening the layer, or rendering the layer porous or more hydrophilic. (The following materials include metal oxide particles but the metal oxide particles hereinafter referred to do not substantially have a light-to-heat conversion function.)

(Porosity Providing Material)

The hydrophilic layer in the invention can contain necklace-shaped colloidal silica as a porosity providing material. As the hydrophilic layer invention, even if it is less porous, has a good water retention property, the porosity providing material content of the hydrophilic layer is preferably from 0 to 30% by weight, and more preferably from 0 to 15% by weight.

The necklace-shaped colloidal silica to be used in the invention is a generic term of an aqueous dispersion system of spherical silica having a primary particle size of the order of nm. The necklace-shaped colloidal silica to be used in the invention means a "pearl necklace-shaped" colloidal silica formed by connecting spherical colloidal silica particles each having a primary particle size of from 10 to 50 μm so as to attain a length of from 50 to 400 nm. The term of "pearl necklace-shaped" means that the image of connected colloidal silica particles is like to the shape of a pearl necklace. The bonding between the silica particles forming the necklace-shaped colloidal silica is considered to be —Si—O—Si—, which is formed by dehydration of —SiOH groups located on the surface of the silica particles. Concrete examples of the necklace-shaped colloidal silica include Snowtex-PS series produced by Nissan Kagaku Kogyo, Co., Ltd.

As the products, there are Snowtex-PS-S (the average particle size in the connected state is approximately 110 nm), Snowtex-PS-M (the average particle size in the connected state is approximately 120 nm) and Snowtex-PS-L (the average particle size in the connected state is approximately 170 nm). Acidic colloidal silicas corresponding to each of the above-mentioned are Snowtex-PS-S-O, Snowtex-PS-M-O and Snowtex-PS-L-O, respectively.

Among them, the use of Snowtex-PS-S, Snowtex-PS-M or Snowtex-PS-L, each being alkaline colloidal silica particles, is particularly preferable since the strength of the hydrophilic layer is increased and occurrence of background contamination is inhibited even when a lot of prints are printed.

The hydrophilic layer in the invention can contain porous metal oxide particles as another prosity providing material. Examples of the porous metal oxide particles include porous silica particles, porous aluminosilicate particles or zeolite particles as described later.

(Porous Silica Particles, Porous Aluminosilicate Particles)

The porous silica particles are ordinarily produced by a wet method or a dry method. By the wet method, the porous silica particles can be obtained by drying and pulverizing a gel prepared by neutralizing an aqueous silicate solution, or pulverizing the precipitate formed by neutralization. By the dry method, the porous silica particles are prepared by combustion of silicon tetrachloride together with hydrogen and oxygen to precipitate silica. The porosity and the particle size of such particles can be controlled by variation of the production conditions. The porous silica particles prepared from the gel by the wet method is particularly preferred.

The porous aluminosilicate particles can be prepared by the method described in, for example, JP O.P.I. No. 10-71764. Thus prepared aluminosilicate particles are amorphous complex particles synthesized by hydrolysis of aluminum alkoxide and silicon alkoxide as the major components. The particles can be synthesized so that the ratio of alumina to silica in the particles is within the range of from 1:4 to 4:1. Complex particles composed of three or more components prepared by an addition of another metal alkoxide may also be used in the invention. In such a particle, the porosity and the particle size can be controlled by adjustment of the production conditions.

The porosity of the particles is preferably not less than 1.0 ml/g, more preferably not less than 1.2 ml/g, and most preferably of from 1.8 to 2.5 ml/g, in terms of pore volume before the dispersion. The pore volume is closely related to water retention of the coated layer. As the pore volume increases, the water retention is increased, stain is difficult to occur, and water tolerance is high. Particles having a pore volume of more than 2.5 ml/g are brittle, resulting in lowering of durability of the layer containing them. Particles having a pore volume of less than 1.0 ml/g results in lowering of anti-stain property or water tolerance in printing.

The particle size of the particles dispersed in the hydrophilic layer (or in the dispersed state before formed as a layer) is preferably not more than 1 μm, and more preferably not more than 0.5 μm. Presence in the hydrophilic layer of particles with an extremely large size forms porous and sharp protrusions on the hydrophilic layer surface, and ink is likely to remain around the protrusions, which may produce stain at non-image portions of the printing plate and on the blanket of a press during printing.

(Zeolite Particles)

Zeolite is a crystalline aluminosilicate, which is a porous material having voids of a regular three dimensional net work structure and having a pore size of 0.3 to 1 nm.

The size of the porous inorganic particles in the hydrophilic layer is preferably not more than 1 μm, and more preferably not more than 0.5 μm.

[Protrusion Formation Particles]

The hydrophilic layer in the invention can contain, as protrusion formation particles, inorganic particles with a particle size of not less than 1 μm or inorganic material coated particles. Examples of the inorganic particles include particles of known metal oxides such silica, alumina, titania and zirconia. However, porous metal oxide particles are preferably used in order to prevent sedimentation of the particles in the coating solution.

The porous particles as described above such as porous silica particles, porous aluminosilicate particles or zeolite particles can be preferably used as the protrusion formation particles.

As the inorganic material coated particles, there are, for example, particles in which organic particles such as particles of PMMA or polystyrene as core particles are coated with inorganic particles with a particle size smaller that that of the core particles. The particle size of the inorganic particles is preferably from 1/10 to 1/100 of that of the core particles. As the inorganic particles, particles of known metal oxides such silica, alumina, titania and zirconia can be used. The porous particles as described above such as porous silica particles, porous aluminosilicate particles or zeolite particles can be preferably used as the irregularity-forming material.

Various coating methods can be used, but a dry process is preferred which core particles collide with particles for coating at high speed in air as in a hybridizer to push the particles for coating in the core particle surface and fix, whereby the core particles are coated with the particles for coating.

Particles, in which the organic core particles are plated with metal, can be used. As such particles, there is, for example, "Micropearl AU", produced by SEKISUI KAGAKU KOGYO Co, Ltd., in which resin particles are plated with gold.

The hydrophilic layer in the invention can contain, as the protrusion formation particles, hydrophilic organic particles with a particle size of not less than 1 μm. Examples of the hydrophilic organic particles include calcium alginate particles and chitosan particles. The chitosan particles are preferably used, since they improve dispersion stability of particles and coatability of the hydrophilic layer.

The particle size of the protrusion formation particles is preferably from 1 to 10 μm, more preferably from 1.5 to 8 μm, and still more preferably from 2 to 6 μm.

[Metal Oxide Particles]

Examples of the metal oxide particles include colloidal silica particles, an alumina sol, a titania sol and another metal oxide sol. The metal oxide particles may have any shape such as spherical, needle-like, and feather-like shape. The average particle size is preferably from 3 to 100 nm, and plural kinds of metal oxide each having a different particle size may be used in combination. The metal oxide particle content of the hydrophilic layer is preferably from 5 to 60% by weight, and more preferably from 10 to 60% by weight. The surface of the particles may be subjected to surface treatment.

The metal oxide particles can be used as a binder, utilizing its layer forming ability. The metal oxide particles are suitably used in a hydrophilic layer since they minimize lowering of the hydrophilicity of the layer as compared with an organic compound binder.

Among the above-mentioned, colloidal silica is particularly preferred. The colloidal silica has a high layer forming ability under a drying condition with a relative low temperature, and can provide a good layer strength. It is known that the binding force of the colloidal silica particles is become larger with decrease of the particle size. The average particle size of the colloidal silica particles to be used in the invention is preferably not more than 20 nm, and more preferably 3 to 15 nm. Alkaline colloidal silica particles of colloidal silica particles show the effect of inhibiting occurrence of the background contamination. Accordingly, the use of the alkaline colloidal silica particles is particularly preferable. Examples of the alkaline colloidal silica particles having the average particle size within the foregoing range include Snowtex-20 (average particle size: 10 to 20 nm), Snowtex-30 (average particle size: 10 to 20 nm), Snowtex-40 (average particle size: 10 to 20 nm), Snowtex-N (average particle size: 10 to 20 nm), Snowtex-S (average particle size: 8 to 11 nm) and Snowtex-XS (average particle size: 4 to 6 nm), each produced by Nissan Kagaku Co., Ltd.

[Layer Structural Mineral Particles]

The hydrophilic layer of the printing plate material in the invention can contain layer structural mineral particles as a metal oxide. Examples of the layer structural mineral particles include a clay mineral such as kaolinite, halloysite, talk, smectite such as montmorillonite, beidellite, hectorite and saponite, vermiculite, mica and chlorite; hydrotalcite; and a layer structural polysilicate such as kanemite, makatite, ilerite, magadiite and kenyte. Among them, ones having a higher electric charge density of the unit layer are higher in the polarity and in the hydrophilicity. Preferable charge density is not less than 0.25, more preferably not less than 0.6. Examples of the layer structural mineral particles having such a charge density include smectite having a negative charge density of from 0.25 to 0.6 and bermiculite having a negative charge density of from 0.6 to 0.9. Synthesized fluorinated mica is preferable since one having a stable quality, such as the particle size, is available. Among the synthesized fluorinated mica, swellable one is preferable and one freely swellable is more preferable.

An intercalation compound of the foregoing layer structural mineral particles such as a pillared crystal, or one treated by an ion exchange treatment or a surface treatment such as a silane coupling treatment or a complication treatment with an organic binder is also usable.

The planar structural mineral particles are preferably in the plate form, and have an average particle size (an average of the largest particle length) of preferably not more than 20 μm, and an average aspect ratio (the largest particle length/the particle thickness) of preferably not less than 20, and more preferably not less than 50, in a state contained in the layer including the case that the particles are subjected to a swelling process and a dispersing layer-separation process. The particles more preferably have an average particle size of preferably not more than 5 μm, and an average aspect ratio of not less than 50, and still more preferably have an average particle size of preferably not more than 1 μm, and an average-aspect ratio of not less than 50. When the particle size is within the foregoing range, continuity to the parallel direction, which is a trait of the layer structural particle, and softness, are given to the coated layer so that a strong dry layer in which a crack is difficult to be formed can be obtained. The coating solution containing particle materials in a large amount can minimize particle sedimentation due to a viscosity increasing effect of the layer structural mineral particles.

The content of the layer structural mineral particles is preferably from 0.1 to 30% by weight, and more preferably from 1 to 10% by weight based on the total weight of the layer. Particularly, the addition of the swellable synthesized fluorinated mica or smectite is effective if the adding amount is small. The layer structural mineral particles may be added in the form of powder to a coating liquid, but it is preferred that gel of the particles which is obtained by being swelled in water, is added to the coating liquid in order to obtain a good dispersity according to an easy coating liquid preparation method which requires no dispersion process comprising dispersion due to media.

[Other Materials]

An aqueous solution of a silicate is also usable as another additive to the hydrophilic matrix phase in the invention. An alkali metal silicate such as sodium silicate, potassium silicate or lithium silicate is preferable, and the $SiO_2/M_2O$ is preferably selected so that the pH value of the coating liquid after addition of the silicate does not exceed 13 in order to prevent dissolution of the porous metal oxide particles or the colloidal silica particles.

An inorganic polymer or an inorganic-organic hybrid polymer prepared by a sol-gel method employing a metal alkoxide. Known methods described in S. Sakka "Application of Sol-Gel Method" or in the publications cited in the above publication can be applied to prepare the inorganic polymer or the inorganic-organic hybridpolymer by the sol-gel method.

In the invention, the hydrophilic layer may contain a water soluble resin or a water dispersible resin. Examples thereof include polysaccharides, polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, and polyvinyl pyrrolidone.

As the polysaccharide, starches, celluloses, polyuronic acid and pullulan can be used. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable.

A water-soluble surfactant may be added for improving the coating ability of the coating liquid for the hydrophilic layer in the invention. A silicon atom-containing surfactant and a fluorine atom-containing surfactant are preferably used. The silicon atom-containing surfactant is especially preferred in that it minimizes printing contamination. The content of the surfactant is preferably from 0.01 to 3% by weight, and more preferably from 0.03 to 1% by weight based on the total weight of the hydrophilic layer (or the solid content of the coating liquid).

The hydrophilic layer in the invention can contain a phosphate. Since a coating liquid for the hydrophilic layer is preferably alkaline, the phosphate to be added to the hydrophilic layer is preferably sodium phosphate or sodium monohydrogen phosphate. The addition of the phosphate provides improved reproduction of dots at shadow portions. The content of the phosphate is preferably from 0.1 to 5% by weight, and more preferably from 0.5 to 2% by weight in terms of amount excluding hydrated water.

The dry coating amount of the hydrophilic layer is preferably from 0.1 to 20 $g/m^2$, more preferably from 0.5 to 15 $g/m^2$, and still more preferably from 1 to 10 $g/m^2$.

(Thermosensitive Image Formation Layer)

The thermosensitive image formation layer is a layer capable of forming an image by imagewise heating, and contains thermoplastic compounds such as heat-melting materials or heat-fusible materials, or materials (hydrophobe precursors which change from hydrophilic property to oleophilic property by heating. Heating is carried out employing heat generated on actinic ray exposure, and preferably heat generated on laser exposure.

It is preferred that the thermosensitive image formation layer in the invention contains the thermoplastic compounds in the form of particles (hereinafter also referred to as thermoplastic particles). That is, the heat-melting materials and heat-fusible materials are preferably heat-melting particles and heat-fusible particles, respectively.

The thermoplastic particle content of the thermosensitive image formation layer is preferably from 50 to 90% by weight, and more preferably from 55 to 80% by weight.

One preferred embodiment of the thermosensitive image formation layer in the invention contains a hydrophobe precursor. As the hydrophobe precursor can be used a polymer whose property is capable of changing from a hydrophilic property (a water dissolving property or a water swelling property) to a hydrophobic property by heating. Examples of the hydrophobe precursor include a polymer having an aryldiazosulfonate unit as disclosed in for example, Japanese Patent O.P.I. Publication No. 2000-56449.

The heat melting particles are particularly particles having a low melt viscosity, which are particles formed from materials generally classified into wax. The materials preferably have a softening point of from 40° C. to 120° C. and a melting point of from 60° C. to 150° C., and more preferably a softening point of from 40° C. to 100° C. and a melting point of from 60° C. to 120° C. The melting point less than 60° C. has a problem in storage stability and the melting point exceeding 300° C. lowers ink receptive sensitivity.

Materials usable include paraffin wax, polyolefin wax, polyethylene wax, microcrystalline wax, and fatty acid ester and fatty acid. The molecular weight thereof is approximately from 800 to 10,000. A polar group such as a hydroxyl group, an ester group, a carboxyl group, an aldehyde group and a peroxide group may be introduced into the wax by oxidation to increase the emulsification ability. Moreover, stearoamide, linolenamide, laurylamide, myristylamide, hardened cattle fatty acid amide, parmitylamide, oleylamide, rice bran oil fatty acid amide, palm oil fatty acid amide, a methylol compound of the above-mentioned amide compounds, methylenebissteastearoamide and ethylenebissteastearoamide may be added to the wax to lower the softening point or to raise the working efficiency. A cumarone-indene resin, a rosin-modified phenol resin, a terpene-modified phenol resin, a xylene resin, a ketone resin, an acryl resin, an ionomer and a copolymer of these resins may also be usable.

Among them, polyethylene wax, microcrystalline wax, fatty acid ester, and fatty acid are preferably contained. A high sensitive image formation can be performed since these materials each have a relative low melting point and a low melt viscosity. These materials each have a lubrication ability. Accordingly, even when a shearing force is applied to the surface layer of the printing plate precursor, the layer damage is minimized, and resistance to stain which may be caused by scratch is further enhanced.

The heat melting particles are preferably dispersible in water. The average particle size thereof is preferably from 0.01 to 10 μm, and more preferably from 0.1 to 3 μm, in view of on-press developability or resolution.

The composition of the heat melting particles may be continuously varied from the interior to the surface of the particles. The particles may be covered with a different material. Known microcapsule production method or sol-gel method can be applied for covering the particles.

It is especially preferred that the thermosensitive image formation layer contains microcapsules encapsulating heat-melting particles.

The heat melting particle content of the thermosensitive image formation layer is preferably 50 to 90% by weight, and more preferably 55 to 80% by weight.

The heat fusible particles in the invention include thermoplastic hydrophobic polymer particles. Although there is no specific limitation to the upper limit of the softening point of the thermoplastic hydrophobic polymer, the softening point is preferably lower than the decomposition temperature of the polymer. The weight average molecular weight (Mw) of the thermoplastic hydrophobic polymer is preferably within the range of from 10,000 to 1,000,000.

Examples of the polymer consisting the polymer particles include a diene (co)polymer such as polypropylene, polybutadiene, polyisoprene or an ethylene-butadiene copolymer; a synthetic rubber such as a styrene-butadiene copolymer, a methyl methacrylate-butadiene copolymer or an acrylonitrile-butadiene copolymer; a (meth)acrylate (co)polymer or a (meth)acrylic acid (co)polymer such as polymethyl methacrylate, a methyl methacrylate-(2-ethylhexyl)acrylate copolymer, a methyl methacrylate-methacrylic acid copolymer, or a methyl acrylate-(N-methylolacrylamide); polyacrylonitrile; a vinyl ester (co)polymer such as a polyvinyl acetate, a vinyl acetate-vinyl propionate copolymer and a vinyl acetate-ethylene copolymer, or a vinyl acetate-2-hexylethyl acrylate copolymer; and polyvinyl chloride, polyvinylidene chloride, polystyrene and a copolymer thereof. Among them, the (meth)acrylate polymer, the (meth)acrylic acid (co)polymer, the vinyl ester (co)polymer, the polystyrene and the synthetic rubbers are preferably used.

The polymer particles may be prepared from a polymer synthesized by any known method such as an emulsion polymerization method, a suspension polymerization method, a solution polymerization method and a gas phase polymerization method. The particles of the polymer synthesized by the solution polymerization method or the gas phase polymerization method can be produced by a method in which an organic solution of the polymer is sprayed into an inactive gas and dried, and a method in which the polymer is dissolved in a water-immiscible solvent, then the resulting solution is dispersed in water or an aqueous medium and the solvent is removed by distillation. In both of the methods, a surfactant such as sodium lauryl sulfate, sodium dodecylbenzenesulfate or polyethylene glycol, or a water-soluble resin such as poly(vinyl alcohol) may be optionally used as a dispersing agent or stabilizing agent.

The heat fusible particles are preferably dispersible in water. The average particle size of the heat fusible particles is preferably from 0.01 to 10 μm, and more preferably from 0.1 to 3 μm.

Further, the composition of the heat fusible particles may be continuously varied from the interior to the surface of the particles. The particles may be covered with a different material. As a covering method, known methods such as a microcapsule method and a sol-gel method are usable.

The heat fusible particle content of the layer is preferably from 1 to 90% by weight, and more preferably from 5 to 80% by weight based on the total weight of the layer.

It is especially preferred that the thermosensitive image formation layer contains microcapsules encapsulating heat-fusible particles.

Microcapsules used in the printing plate material in the invention include those encapsulating oleophilic materials disclosed in Japanese Patent O.P.I. Publication Nos. 2002-2135 and 2002-19317.

The average microcapsule size of the microcapsules is preferably from 0.1 to 10 μm, more preferably from 0.3 to 5 μm, and still more preferably from 0.5 to 3 μm.

The thickness of the microcapsule wall is preferably from 1/100 to 1/5 of the average microcapsule size, and more preferably from 1/50 to 1/10 of the average microcapsule size. The microcapsule content of the image formation layer is preferably from 5 to 100% by weight, more preferably from 20 to 95% by weight, and most preferably from 40 to 90% by weight.

As the materials for the microcapsule wall, known materials can be used. As a method of manufacturing the microcapsules, known methods can be used. The materials for the microcapsule wall and the manufacturing method of the microcapsule wall can be applied which are disclosed in for example, Tamotsu Kondo, Masumi Koishi, "New Edition Microcapsule, Its Manufacturing Method, Properties And Application", published by Sankyo Shuppan Co., Ltd., or disclosed in literatures cited in it.

(Water Soluble Polymer)

The thermosensitive image formation layer in the invention contains a water-soluble polymer in an amount of from 10 to 50% by weight, in view of sensitivity, printing durability or prevention of stain occurrence due to scratches. The water-soluble polymer content of the thermosensitive image formation layer in the invention is preferably from 20 to 45% by weight.

It is especially preferred in the invention that the thermosensitive image formation layer contains the water-soluble polymer in an amount of from 20 to 45% by weight and the hydrophilic layer contains the metal oxide particles in an amount of from 45 to 85% by weight.

The water-soluble polymer hereinafter referred to is a water-soluble polymer having a solubility at 25° C. of not less than 1 g. Examples thereof include polysaccharides, polyethylene oxide, polypropylene oxide, polyvinyl alcohol, polyethylene glycol (PEG), polyvinyl ether, polyacrylic acid, polyacrylic acid salts, polyacrylamide, and polyvinyl pyrrolidone. Among these, polysaccharides, polyacrylic acid, polyacrylic acid salts or polyacrylamide are preferred.

Examples of the polysaccharides include starches, celluloses, polyuronic acid and pullulan. Among these, cellulose derivatives such as a methyl cellulose salt, a carboxymethyl cellulose salt and a hydroxyethyl cellulose salt are preferred, and a sodium or ammonium salt of carboxymethyl cellulose is more preferred. The polyacrylic acid has a molecular weight of preferably from 3,000 to 1,000,000, and more preferably from 5,000 to 500,000.

Among these, polyacrylic acid salts such as sodium polyacrylate is still more preferred. The polyacrylic acid salts are highly effective for a hydrophilization agent of the image formation layer, and a hydrophilic property of the hydrophilic layer surface revealed by on-press development of the image formation layer is improved.

A water-soluble surfactant may be contained in the thermosensitive image formation layer in the invention. A silicon atom-containing surfactant and a fluorine atom-containing surfactant can be used. The silicon atom-containing surfactant is especially preferred in that it minimizes printing contamination. The content of the surfactant is preferably from 0.01 to 3.0% by weight, and more preferably from 0.03 to 1.0% by weight based on the total weight of the image formation layer (or the solid content of the coating liquid).

[Other Materials Optionally Contained in Thermosensitive Image Formation Layer]

The thermosensitive image formation layer can contain the following materials other than those described above.

The thermosensitive image formation layer can contain an infrared absorbing dye. The content of the infrared absorbing dye in the image formation layer is preferably from 0.001 g/m$^2$ to less than 0.2 g/m$^2$, and more from 0.001 g/m$^2$ to less than 0.05 g/m$^2$ per unit area of printing plate material, although it is necessary to consider contamination due to coloring degree of the dye of a printing press on on-press development. It is needless to say that a dye having less coloring degree is preferably used.

Examples of the infrared absorbing dye include a general infrared absorbing dye such as a cyanine dye, a chloconium dye, a polymethine dye, an azulenium dye, a squalenium dye, a thiopyrylium dye, a naphthoquinone dye or an anthraquinone dye, and an organometallic complex such as a phthalocyanine compound, a naphthalocyanine compound, an azo compound, a thioamide compound, a dithiol compound or an indoaniline compound. Exemplarily, the light-to-heat conversion materials include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds may be used singly or in combination.

Compounds described in Japanese Patent O.P.I. Publication Nos. 11-240270, 11-265062, 2000-309174, 2002-49147, 2001-162965, 2002-144750, and 2001-219667 can be preferably used.

The image formation layer in the invention can contain an acid (phosphoric acid or acetic acid) or an alkali (sodium hydroxide, silicate, or phosphate) to adjust pH.

The coating amount of the image formation layer is from 0.01 to 10 g/m$^2$, preferably from 0.1 to 3 g/m$^2$, and more preferably from 0.2 to 2 g/m$^2$.

(Protective Layer)

A protective layer can be provided on the thermosensitive image formation layer.

As materials used in the protective layer, the water-soluble compounds described above can be preferably used.

As the protective layer, the overcoat layer disclosed in Japanese Patent O.P.I. Publication Nos. 2002-19318 and 2002-86948 can be preferably used.

The coating amount of the protective layer is from. 0.01 to 10 g/m$^2$, preferably from 0.1 to 3 g/m$^2$, and more preferably from 0.2 to 2 g/m$^2$.

(Exposure)

In the invention, the printing plate material is preferably exposed with laser to form an image. As the laser, a thermal laser is especially preferred.

For example, scanning exposure is preferred which is carried out employing an infrared or near-infrared laser which emits light having a wavelength of from 700 to 1500 nm. As the laser, a gas laser can be used, but a semiconductor laser, which emits near-infrared light, is preferably used.

The scanning exposure device used in the invention may be any as long as it can form an image on the surface of a printing plate material employing the semiconductor laser, based on image formation from a computer.

Generally, the scanning exposure devices include those employing the following processes.

(1) a process in which a plate material provided on a fixed horizontal plate is scanning exposed in two dimensions, employing one or several laser beams.

(2) a process in which the surface of a plate material provided along the inner peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

(3) a process in which the surface of a plate material provided along the outer peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

In the invention, the process (3) above is preferable, and especially preferable when a printing plate material mounted on a plate cylinder of a printing press is scanning exposed.

(Printing)

In the invention, a conventional printing method employing a dampening solution and printing ink can be applied.

In the invention, use of a dampening solution, which does not substantially contains isopropanol, is preferably used. The dampening solution which does not substantially contains isopropanol means a dampening solution containing isopropanol in an amount of not more than 0.5% by weight based on the content of water.

The exposed printing plate material is employed for printing without a special development. It is preferred that the printing plate material, after imagewise exposed employing laser, is mounted on a plate cylinder of a printing press, supplied with a dampening solution or both a dampening solution and printing ink to form an image, and then printing is carried out.

The printing plate material is mounted on a plate cylinder of a printing press and imagewise exposed, or after imagewise exposed is mounted on a plate cylinder of a printing press. The imagewise exposed printing plate material is brought into contact with a dampening roller and an inking roller while rotating the plate cylinder to remove the image formation layer at non-image portions on the printing press.

The removal of the image formation layer at non-image portions, that is, on-press development will be explained below.

Removal on a press of the image formation layer at non-image portions (unexposed portions) of a printing plate material, which is mounted on the plate cylinder, can be carried out by bringing a dampening roller and an inking roller into contact with the image formation layer while rotating the plate cylinder, or by various sequences such as those described below or another appropriate sequence. The supplied amount of dampening solution may be adjusted to be greater or smaller than the amount ordinarily supplied in printing, and the adjustment may be carried out stepwise or continuously.

(1) A dampening roller is brought into contact with the image formation layer of a printing plate material on the plate cylinder during one to several tens of rotations of the plate cylinder, and then an inking roller brought into contact with the image formation layer during the next one to tens of rotations of the plate cylinder. Thereafter, printing is carried out.

(2) An inking roller is brought into contact with the image formation layer of a printing plate material on the plate cylinder during one to several tens of rotations of the plate cylinder, and then a dampening roller brought into contact with the image formation layer during the next one to tens of rotations of the plate cylinder. Thereafter, printing is carried out.

(3) An inking roller and a dampening roller are brought into contact with the image formation layer of a printing plate material on the plate cylinder during one to several tens of rotations of the plate cylinder. Thereafter, printing is carried out.

EXAMPLES

The present invention will be explained below employing the following examples. In the examples, "parts" is parts by weight, unless otherwise specifically specified.

Example 1

[Preparation of Support 1]

Both surfaces of a 175 μm thick biaxially stretched polyester sheet were corona discharged under condition of 8 $W/m^2$·minute. Then, the surface on one side of the resulting sheet was coated with the following subbing layer coating solution a to give a first subbing layer with a dry thickness of 0.8 μm, and then coated with the following subbing layer coating solution b to give a second subbing layer with a dry thickness of 0.1 μm, while the first subbing layer was corona discharged under condition of 8 $W/m^2$·minute, each layer was dried at 180° C. for 4 minutes (subbing layer A was formed). Successively, the surface on the other side of the resulting sheet was coated with the following subbing layer coating solution c to give a third subbing layer with a dry thickness of 0.8 μm, and then coated with the following subbing layer coating solution d to give a fourth subbing layer with a dry thickness of 1.0 μm, while the third subbing layer was corona discharged under condition of 8 $W/m^2$·minute, each layer was dried at 180° C. for 4 minutes (subbing layer B was formed. Thus, support 1 having a subbing layer on each surface was prepared. The support 1 had a surface electric resistance at 25° C. and 25% RH of $10^8$ Ω.

Subbing layer coating solution a

| | |
|---|---|
| Latex of styrene/glycidyl methacrylate/butyl acrylate (60/39/1) copolymer (Tg = 75° C.) | 6.3 parts (in terms of solid content) |
| Latex of styrene/glycidyl methacrylate/butyl acrylate (20/40/40) copolymer | 1.6 parts (in terms of solid content) |
| Anionic surfactant S-1 | 0.1 parts |
| Water | 92.0 parts |

Subbing layer coating solution b

| | |
|---|---|
| Gelatin | 1.0 parts |
| Anionic surfactant S-1 | 0.05 parts |
| Hardener H-1 | 0.02 parts |
| Matting agent (Silica particles with an average particle size of 3.5 μm) | 0.02 parts |
| Antifungal agent F-1 | 0.01 parts |
| Water | 98.9 parts |

S-1

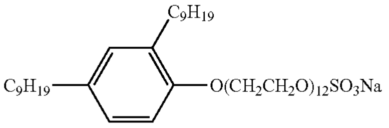

H-1

-continued

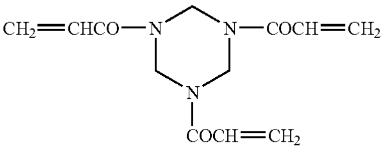

F-1

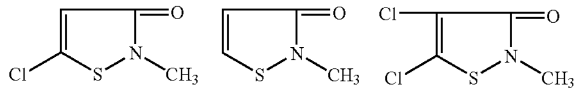

(Component A) (Component B) (Component C)

(Component A):(Component B):(Component C) = 50:46:4 (by mole)

Subbing layer coating solution c

| | |
|---|---|
| Latex of styrene/glycidyl methacrylate/butyl acrylate (20/40/40) copolymer | 0.4 parts |
| Latex of styrene/glycidyl methacrylate/butyl acrylate/acetoacetoxyethyl methacrylate (39/40/20/1) copolymer | 7.6 parts |
| Anionic surfactant S-1 | 0.1 parts |
| Water | 91.9 parts |

Subbing layer coating solution d

| | |
|---|---|
| Conductive composition of *Component d-1/**Component d-2/***Component d-3 (=66/31/1) | 6.4 parts |
| Hardener H-2 | 0.7 parts |
| Anionic surfactant S-1 | 0.07 parts |
| Silica particles with an average particle size of 3.5 μm) | 0.03 parts |
| Water | 92.8 parts |

*Component d-1
Copolymer of styrene sulfonic acid/maleic acid (50/50 by mole) (Anionic polymer)
**Component d-2
Latex of styrene/glycidyl methacrylate/butyl acrylate (20/40/40 by mole) copolymer
***Component d-3
Copolymer of styrene/sodium isoprene sulfonate (80/20 by mole) (Polymer surfactant)
H-2
Mixture of three compounds below

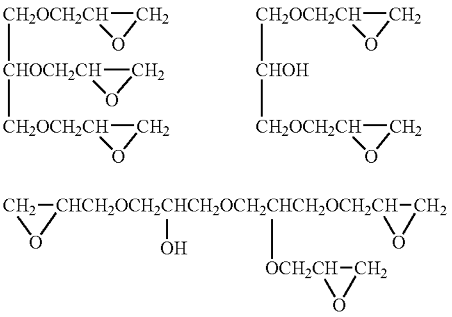

[Preparation of Support 2]

A 0.24 mm thick aluminum plate (1050, H16) was immersed in an aqueous 1% by weight sodium hydroxide solution at 50° C. to give an aluminum dissolution amount of 2 $g/m^2$, washed with water, immersed in an aqueous 0.1% by weight hydrochloric acid solution at 25° C. for 30 seconds to neutralize, and then washed with water.

Subsequently, the aluminum plate was subjected to an electrolytic surface-roughening treatment in an electrolytic solution containing 10 g/liter of hydrochloric acid and 0.5 g/liter of aluminum at a peak current density of 50 A/dm$^2$ employing an alternating current with a sine waveform, in which the distance between the plate surface and the electrode was 10 mm. The electrolytic surface-roughening treatment was divided into 10 treatments, in which the quantity of electricity used in one treatment (at a positive polarity) was 60 C/dm$^2$, and the total quantity of electricity used (at a positive polarity) was 600 C/dm$^2$. Standby time of 4 seconds, during which no surface-roughening treatment was carried out, was provided after each of the separate electrolytic surface-roughening treatments.

Subsequently, the resulting aluminum plate was immersed in an aqueous 1% by weight sodium hydroxide solution at 50° C. and etched to give an aluminum etching amount (including smut produced on the surface) of 2 g/m$^2$, washed with water, neutralized in an aqueous 10% by weight sulfuric acid solution at 25° C. for 10 seconds, and washed with water. Subsequently, the aluminum plate was subjected to anodizing treatment in an aqueous 20% by weight sulfuric acid solution at a constant voltage of 20 V, in which a quantity of electricity of 150 C/dm$^2$ was supplied, and washed with water.

The washed surface of the plate was squeegeed, and the plate was immersed in an aqueous 0.5% by weight disodium hydrogen phosphate solution at 70° C. for 30 seconds, washed with water, and dried at 80° C. for 5 minutes. Thus, the support 2 was obtained.

The surface roughness Ra of the support 2 was 0.7 μm.

[Measurement of Surface Roughness]

A platinum-rhodium layer with a thickness of 1.5 nm are vacuum-deposited onto a sample surface, and surface roughness is measured under condition of a magnification of 20, employing a non-contact three dimensional surface roughness measuring device RST plus produced by WYKO Co., Ltd., (in which the measurement area is 222.4 μm×299.4 μm). The resulting measurement is subjected to slope correction and to filtering treatment of Median Smoothing. Five portions of each sample are measured and the average of the measurements is defined as surface roughness Ra of the sample.

Example 1

(Preparation of Hydrophilic Layer Coating Solution)

Materials of each composition as shown in Table 1 were sufficiently mixed while stirring at 3000 rpm for 5 minutes, employing a homogenizer, and filtered to obtain hydrophilic layer coating solutions 1 through 6 with a solid content of 25% by weight.

Hydrophilic Layer Coating Solution (In Table 1, numerical values are parts by weight unless otherwise specified.)

TABLE 1

| | Hydrophilic Layer | | | | | |
|---|---|---|---|---|---|---|
| Materials | 1 | 2 | 3 | 4 | 5 | 6 |
| Metal oxide particles having light-to-heat conversion function, Black iron oxide particles ABL-207 (produced by Titan Kogyo K.K., octahedral form, average particle diameter: 0.2 μm, acicular ratio: substantially 1, specific surface area: 6.7 m$^2$/g, Hc: 9.95 kA/m, σs: 85.7 Am$^2$/kg, σr/σs: 0.112) | 8.75 | 11.25 | 12.50 | 13.75 | 15.00 | 21.25 |
| Colloidal silica (alkali type): Snowtex XS (solid content: 20% by weight, produced by Nissan Kagaku Co., Ltd.) | 79.37 | 66.87 | 60.62 | 54.37 | 48.12 | 18.13 |
| Aqueous 10% by weight sodium phosphate.dodecahydrate solution (Reagent produced by Kanto Kagaku Co., Ltd.) | 1.13 | 1.13 | 1.13 | 1.13 | 1.13 | 0.50 |
| Aqueous 10% by weight solution of water-soluble chitosan Flonac S (produced by Kyowa Technos Co., Ltd.) | 2.50 | 2.50 | 2.50 | 2.50 | 2.50 | 0.62 |
| Aqueous 1% by weight solution of surfactant Surfinol 465 (produced by Air Products Co., Ltd.) | 1.25 | 1.25 | 1.25 | 1.25 | 1.25 | 1.25 |
| Pure water | 7.00 | 17.00 | 22.00 | 27.00 | 32.00 | 58.25 |
| Content (% by weight) of metal oxide particles having light-to-heat conversion function in the total solid content | 35.0 | 45.0 | 50.0 | 55.0 | 60.0 | 85.0 |

(Preparation of Thermosensitive Image Formation Layer Coating Solution)

Materials of each composition as shown in Table 2 were sufficiently mixed while stirring, employing a homogenizer, and filtered to obtain thermosensitive image formation layer coating solutions 1 through 6 with a solid content of 10% by weight.

Thermosensitive Image Formation Layer Coating Solution (In Table 2, numerical values are parts by weight unless otherwise specified.)

TABLE 2

| | Hydrophilic Layer | | | | | |
|---|---|---|---|---|---|---|
| Materials | 1 | 2 | 3 | 4 | 5 | 6 |
| Hydrophobe precursor Carnauba wax emulsion A118 (the wax having an average particle diameter of 0.3 μm, a softening point of 65° C., a melting point of 80° C., a melt viscosity at 140° C. of 8 cps, and having a solid content of 40% by weight, produced by Gifu Shellac Co., Ltd.) | 23.75 | 22.00 | 21.25 | 20.00 | 11.25 | 13.75 |
| Water-soluble polymer 1 Aqueous 4% by weight solution of carboxymethylcellulose sodium salt CMC 1220 (produced by Daiseru Kagaku Co., Ltd.) | | 30.00 | | | | |
| Water-soluble polymer 2 Aqueous solution of sodium polyacrylate AQUALIC DL522 (solid content 30%, produced by Nippon Shokubai Co., Ltd.) | 1.67 | | 5.00 | 6.67 | 18.33 | 15.00 |
| Pure water | 74.58 | 48.00 | 73.75 | 73.33 | 70.42 | 71.25 |
| Content (% by weight) of the water-soluble polymer in the total solid content | 5.0 | 12.0 | 15.0 | 20.0 | 55.0 | 45.0 |

(Preparation of Printing Plate Material Sample)

The resulting hydrophilic layer coating solution and thermosensitive image formation layer coating solution were coated on support 1 to obtain printing plate material samples 1 through 19 as shown in Table 3. The combination of the hydrophilic layer coating solution and the thermosensitive image formation layer coating solution, and the dry thickness of each layer were shown in Table 3.

In the preparation above, the hydrophilic layer coating solution was coated on the support employing a wire bar to give a hydrophilic layer with the specific dry thickness, and dried at 120° C. for 2 minutes. Subsequently, the thermosensitive image formation layer-coating solution was coated on the resulting hydrophilic layer employing a wire bar to give a thermosensitive image formation layer with the specific dry thickness, and dried at 55° C. for 3 minutes. Thereafter, the resulting sample was aged at 55° C. for 24 hours. Thus, printing plate material sample was obtained.

(Image Formation Employing Infrared Laser)

Each of the resulting printing plate material samples was mounted on an exposure drum, and imagewise exposed. While the exposure energy was changed from 80 to 240 mJ/cm$^2$ at an interval of 20 mJ/cm$^2$, exposure was carried out employing an infrared laser (having a wavelength of 830 nm and a beam spot diameter of 18 μm) at a resolution of 2400 dpi ("dpi" herein shows the number of dots per 2.54 cm) and at a screen line number of 75 to record an image. The recorded image had a solid image, a dot image with a dot area of 1 to 99%, and a line and space image of 2400 dpi.

(Printing Method)

Printing was carried out employing a printing press, DAIYA 1F-1 produced by Mitsubishi Jukogyo Co., Ltd., and employing a coated paper, a dampening solution, a 2% by weight solution of Astromark 3 (produced by Nikken Kagaku Kenkyusyo Co., Ltd.), and printing ink (Toyo King Hyecho M Magenta, produced by Toyo Ink Manufacturing Co.).

Each of the exposed printing plate material samples was mounted on a plate cylinder of the printing press, and printing was carried out in the same printing sequence as a conventional PS plate. The digital data showing the supplied amount of the dampening solution was 40.

(Evaluation)

Evaluation was carried out employing one thousandth print. The lowest exposure energy completely reproducing a 1% dot image was defined as a measure of sensitivity. The less the lowest exposure energy, the higher sensitivity is. When the recorded image was not reproduced even at an exposure energy of 240 mJ/cm$^2$, it was evaluated as image formation fault.

[Evaluation 1 of Stain Due to Scratches]

Scratches were marked at portions corresponding to non-image area of the resulting exposed sample, employing a scratch tester produced by HEIDON CO., LTD. In the scratch marking, a sapphire needle with 0.3 mmφ was employed as a probe, and a weight from 50 to 300 g was loaded while the weight was changed at an interval of 25 g. Then, printing was carried out employing the sample with the scratches. Stain due to the scratches at the 50$^{th}$ copy was visually observed, and the largest weight at which stain due to the scratches was not observed was determined as a measure of stain due to scratches. The larger the largest weight is, the better.

[Evaluation 2 of Stain Due to Scratches]

Scratches were marked at portions corresponding to non-image area of the resulting exposed sample. Then, printing was carried out employing the sample with the scratches, and stain due to the scratches at the 50$^{th}$ copy was visually observed according to the following criteria:

A: No stain was observed.

B: Slight stain was observed.

C: Apparent stain was observed.

The results are shown in Table 3.

[Water-ink Balance]

When printing started and one thousand copies were printed, a supply amount of the dampening solution was reduced to a digital value (showing the supply amount of the dampening water) of 16. Then, printing was continuously carried out while printing ink was supplied to the entire surface of the sample. The digital value being increased by 2 every time 50 prints were obtained, printing was continued till the digital value arrived at 50. Fiftieth print obtained at each digital value was evaluated for water-ink balance.

When printing was carried out employing a printing plate material sample exposed at the exposure energy corresponding to its sensitivity, the digital value showing the smallest supply amount of the dampening solution at which filling-up of the 95% dot image did not occur was regarded as a measure of water and ink balance. A printing plate material sample, which did not form an image, was regarded as image formation fault, and not evaluated. The results are shown in Table 3. The smaller the digital value, the better printability is.

As is apparent from Table 3, inventive samples provide high sensitivity, excellent prevention of stain occurrence due to scratches, and good printability showing that water and ink balance can be easily adjusted.

TABLE 3

| Sample No. | Hydrophilic layer Coating solution | Hydrophilic layer Dry thickness ($g/m^2$) | Thermosensitive image formation layer Coating solution | Thermosensitive image formation layer Dry thickness ($g/m^2$) | Sensitivity ($mJ/cm^2$) | Stain due to scratches Evaluation 1 | Stain due to scratches Evaluation 2 | Water-ink balance | Remarks |
|---|---|---|---|---|---|---|---|---|---|
| 1 | 1 | 5.0 | 1 | 0.7 | 240 | 100 | C | 38 | Comp. |
| 2 | 1 | 5.5 | 4 | 0.5 | * | 300 | A | — | Comp. |
| 3 | 2 | 4.0 | 1 | 0.6 | 180 | 100 | C | 36 | Comp. |
| 4 | 2 | 4.0 | 2 | 0.7 | 200 | 300 | A | 34 | Inv. |
| 5 | 2 | 5.0 | 3 | 0.6 | 200 | 300 | A | 34 | Inv. |
| 6 | 3 | 4.0 | 1 | 0.6 | 160 | 100 | C | 36 | Comp. |
| 7 | 3 | 4.0 | 4 | 0.6 | 180 | 300 | A | 34 | Inv. |
| 8 | 3 | 3.5 | 5 | 0.8 | * | 300 | A | — | Comp. |
| 9 | 4 | 4.0 | 1 | 0.6 | 120 | 75 | C | 34 | Comp. |
| 10 | 4 | 5.0 | 3 | 0.6 | 140 | 300 | A | 34 | Inv. |
| 11 | 4 | 5.0 | 4 | 0.5 | 160 | 300 | A | 32 | Inv. |
| 12 | 4 | 5.0 | 5 | 0.5 | * | 300 | A | — | Comp. |
| 13 | 5 | 5.0 | 1 | 0.5 | 100 | 75 | C | 34 | Comp. |
| 14 | 5 | 3.0 | 2 | 0.6 | 120 | 300 | A | 32 | Inv. |
| 15 | 5 | 4.0 | 3 | 0.6 | 120 | 300 | A | 32 | Inv. |
| 16 | 5 | 4.0 | 4 | 0.6 | 140 | 300 | A | 32 | Inv. |
| 17 | 6 | 4.0 | 6 | 0.5 | 200 | 300 | A | 30 | Inv. |
| 18 | 6 | 5.0 | 2 | 0.4 | 100 | 275 | A | 32 | Inv. |
| 19 | 2 | 4.0 | 6 | 0.4 | 220 | 300 | A | 32 | Inv. |

Comp.: Comparative,
Inv.: Inventive,
*Image formation fault

Example 2

Preparation of Printing Plate Material Sample

The resulting hydrophilic layer coating solution and thermosensitive image formation layer coating solution were coated on support 2 to obtain printing plate material samples 20 through 24 as shown in Table 4. The combination of the hydrophilic layer coating solution and the thermosensitive image formation layer coating solution, and the dry thickness of each layer were shown in Table 4.

The printing plate material samples 20 through 24 were prepared in the same manner as in Example 1.

(Image Formation Employing Infrared Laser)

Each of the resulting printing plate material samples was mounted on an exposure drum, and imagewise exposed. The exposure was carried out employing an infrared laser (having a wavelength of 830 nm and a beam spot diameter of 18 μm) at a resolution of 2400 dpi ("dpi" herein shows the number of dots per 2.54 cm) and at a screen line number of 75 to record an image. Judging from the results of Example 1 above, the exposure energy was 300 $mJ/cm^2$ in samples 17 and 18, and 150 $mJ/cm^2$ in the other samples. The recorded image had a solid image, a dot image with a dot area of 1 to 99%, and a line and space image of 2400 dpi.

(Printing Method)

Printing was carried out in the same manner as in Example 1, except that SHIRAOI, a wood-free paper, was used as a printing sheet, till 20,000 prints were obtained.

(Evaluation)

[Stain Due to Scratches]

Scratches were marked at portions corresponding to non-image area of the resulting exposed sample. Then, printing was carried out employing the sample with the scratches, and stain due to the scratches at the $50^{th}$ copy was visually observed according to the following criteria:

A: No stain was observed.

B: Slight stain was observed.

C: Apparent stain was observed.

The results are shown in Table 4.

[Printing Durability]

Printed image was observed in every $1000^{th}$ copy, and the number of paper sheets printed from when printing started till when unevenness of the solid image or lack of dots at the 2% dot image was observed was counted and evaluated as a measure of printing durability.

TABLE 4

| Sample No. | Hydrophilic layer Coating solution | Hydrophilic layer Dry thickness ($g/m^2$) | Thermosensitive image formation layer Coating solution | Thermosensitive image formation layer Dry thickness ($g/m^2$) | Exposure energy ($mJ/cm^2$) | Stain due to scratches | Printing durability | Remarks |
|---|---|---|---|---|---|---|---|---|
| 20 | 1 | 4.0 | 1 | 0.6 | 300 | C | 12,000 | Comp. |
| 21 | 1 | 4.5 | 3 | 0.6 | 300 | A | 6,000 | Comp. |
| 22 | 3 | 5.0 | 3 | 0.6 | 150 | A | 20,000 | Inv. |
| 23 | 4 | 4.0 | 4 | 0.6 | 150 | A | 18,000 | Inv. |
| 24 | 5 | 3.5 | 4 | 0.6 | 150 | A | 20,000 | Inv. |

Comp.: Comparative,
Inv.: Inventive

As is apparent from Table 4, inventive samples provide high sensitivity and high printing durability, and prevent stain due to scratches.

EFFECT OF THE INVENTION

The present invention can provide a printing plate material for CTP providing high sensitivity, good water-ink balance during printing, and high printing durability, and preventing stain which is likely to occur at a portion with scratches during printing.

What is claimed is:

1. A printing plate material comprising a support and provided thereon, a hydrophilic layer and a thermosensitive image formation layer in that order, wherein the hydrophilic layer contains from 40 to 90% by weight of iron oxide ($Fe_3O_4$) particles in octahedral form and the thermosensitive image formation layer contains from 10 to 50% by weight of a water-soluble polymer.

2. The printing plate material of claim 1, wherein the iron oxide particles have an average particle size of from 0.15 to 1.0 μm.

3. The printing plate material of claim 1, wherein the water-soluble polymer is selected from the group consisting of polysaccharides, polyacrylic acid, polyacrylic acid salts and polyacrylamide.

4. The printing plate material of claim 1, wherein the thermosensitive image formation layer further contains thermoplastic particles.

5. The printing plate material of claim 4, wherein the thermoplastic particle content of the thermosensitive image formation layer is from 50 to 90% by weight.

6. A printing process comprising the steps of:

imagewise exposing the printing plate material of claim 1;

developing the exposed printing plate material on a printing press by supplying a dampening solution or a dampening solution and printing ink to the printing plate material to obtain a printing plate; and carrying out printing employing the printing plate.

* * * * *